United States Patent
Josephson

Patent Number: 5,295,095
Date of Patent: Mar. 15, 1994

[54] METHOD OF PROGRAMMING ELECTRICALLY ERASABLE PROGRAMMABLE READ-ONLY MEMORY USING PARTICULAR SUBSTRATE BIAS

[75] Inventor: Gregg R. Josephson, Aloha, Oreg.

[73] Assignee: Lattice Semiconductor Corporation, Hillsboro, Oreg.

[21] Appl. No.: 748,374

[22] Filed: Aug. 22, 1991

[51] Int. Cl.⁵ .............................. G11C 11/40
[52] U.S. Cl. ................. 365/185; 365/189.09; 307/296.2; 307/469
[58] Field of Search ............ 365/185, 189.09; 307/296.2, 469

[56] References Cited

U.S. PATENT DOCUMENTS 4,388,537  6/1983  Kanuma ............... 307/296.2
4,884,239  11/1989  Ono et al. ............... 365/185

OTHER PUBLICATIONS

T. Nakayama et al., "A5-U-only one-Transistor 256K EEPROM W. Page-Mode Erase," IEEE J. of S-S Ckts., vol. SC-24 #4, Aug. 1989, pp. 911-915.

R. James, "Elec, Rewr. Nonvol. Stor, Hav. Red Wr. vol.," IBM Tech. Discl. Bull, vol. 16 #2, Jul. 1973, pp. 690-691.

N. Anantha et al., "Elec. Eras. F-6 FET Memory Cell," IBM Tech. Discl. Bull., vol. 17 #8, Jan. 1975, pp. 2311-2313.

R. Dockerty, "Nonvolatile Mem. Array W. Single Famos Dev. Per Cell," IBM Tech. Discl. Bull., vol. 17 #8, Jan. 1975, pp. 2314-2315.

Primary Examiner—Joseph E. Clawson, Jr.
Attorney, Agent, or Firm—Skjerven, Morrill, MacPherson, Franklin & Friel

[57] ABSTRACT

The apparent voltage used to program an EEPROM cell is increased by applying a negative voltage to the memory control gate of the sense transistor in the cell. This method is applicable to devices in which the substrate is negatively biased.

8 Claims, 4 Drawing Sheets

ID OF THE INVENTION

This invention relates to electrically erasable programmable read-only memories and in particular to such devices which employ floating gate technology.

BACKGROUND OF THE INVENTION

A typical electrically erasable programmable read-only memory (EEPROM) cell includes two MOS transistors connected in series. An EEPROM of this kind is shown schematically in FIG. 1 and structurally in FIG. 2. It includes a select transistor 10 and a sense transistor 11, which are connected in series between a bit line 13 and an array ground 17. The gate of select transistor 10 is connected to a row line 12. Sense transistor 11 is controlled by a memory gate 16 and a floating gate 15. When the state of the cell is to be read, select transistor 10 is turned on via a voltage applied to row line 12, and a read voltage is applied to bit line 13 to determine the conductive state of sense transistor 11. If sense transistor 11 is conductive (programmed) a current will flow; if it is non-conductive (erased) a current will not flow.

Sense transistor 11 is programmed or erased by applying an appropriate voltage between memory control gate 16 and bit line 13, with select transistor 10 turned on. If memory control gate 16 is grounded and a positive programming voltage (typically about 14.5 V) is applied to bit line 13, electrons tunnel from floating gate 15 through a very thin tunnel oxide layer 18 (shown in FIG. 2) to the N+ region designated 14 in FIG. 2, leaving floating gate 15 with a net positive charge. In this state, the cell is programmed. If bit line 13 is grounded and a positive programming voltage is applied to memory control gate 16, the reverse occurs. Electrons tunnel from N+ region 14 through the very thin oxide layer 18 into floating gate 15, leaving floating gate 15 with a net negative charge. In this state, the cell is erased.

The charge on floating gate 15 determines the threshold voltage of sense transistor 11. If floating gate 15 is positively charged, sense transistor 11 has a relatively low threshold voltage $V_{TL}$. If floating gate 15 is negatively charged, sense transistor 11 has a relatively high threshold voltage $V_{TH}$. Normally, a reference voltage $V_{ref}$ about halfway between $V_{TH}$ and $V_{TL}$ is applied to memory control gate 16. Thus, if sense transistor 11 has been programmed, it will be conductive; if it has been erased, it will be an open circuit.

It is desirable to have the margin between $V_{TH}$ and $V_{TL}$ be as large as possible because a large margin provides for a strong cell current and longer data retention.

For a particular tunnel oxide layer thickness, the margin is primarily determined by two factors: (i) the coupling ratio and (ii) the voltage difference between memory control gate 16 and the common point between sense transistor 10 and select transistor 11 when the cell is being programmed or erased. The latter in turn is proportional to the voltage difference applied between cell memory control gate 16 and bit line 13. With smaller cells and greater cell densities, both of these factors have a tendency to reduce the margin. The coupling ratio is established by the layout of the cell, and a smaller layout tends to reduce the coupling ratio. As explained below, smaller cell dimensions also tend to limit the voltage difference that can be used in programming and erasing the cell.

FIG. 3 illustrates $V_{TH}$ and $V_{TL}$ as a function of the potential difference ($V_{pp}$) between the memory control gate and the bit line during the erase and programming operations, respectively. As FIG. 3 indicates, $V_{TH}$ increases with increasing $V_{pp}$ and $V_{TL}$ decreases with increasing $V_{pp}$. Thus, the margin ($V_{TH}-V_{TL}$) also increases as $V_{pp}$ increases.

The desire for a large margin is in conflict with the increasing miniaturization of EEPROM cells. With thinner oxides, tighter design rules and more highly doped and shallower junctions, breakdown voltages such as punch through, field-aided junction breakdown, and field device turn on tend to decrease. For example, referring to FIG. 2, as the thickness of gate oxide 20 decreases, the field-aided junction breakdown voltage ($BV_{DSS}$) of select transistor 10 decreases as a result of breakdown at the PN junction in the area designated 21 in FIG. 2. Thus, while a thinner gate oxide has the beneficial effect, for example, of increasing the transconductance ($G_m$) in select transistor 10, the price of greater transconductance is a lower $BV_{DSS}$. This in turn limits the voltage which can be used in programming or erasing the cell and makes it more difficult to obtain a wide margin. The relationship between $G_m$ and $BV_{DSS}$, respectively, and the thickness of gate oxide 20 is illustrated in FIG. 4.

SUMMARY OF THE INVENTION

The method of this invention allows the potential difference used in programming an EEPROM cell to be increased without raising the chances of voltage breakdown. This is accomplished using an EEPROM cell with a negatively biased substrate. The memory control gate of the sense transistor is pumped to a negative voltage using a charge pump. Because the substrate is negatively biased, this can be done without the risk of N-channel source-drain diffusion forward-biasing the associated PN junction, which could initiate latch up. The margin is increased one volt for every volt that the memory control gate is negatively biased.

DESCRIPTION OF THE INVENTION

It is known in the art to back-bias the substrate of an MOS device. The primary purpose of this is to reduce junction capacitance and thereby increase the speed of the cell. Typically, the substrate is biased to approximately −2.5 V.

The lower threshold voltage $V_{TL}$ of the sense transistor in an EEPROM is determined by the coupling ratio and the potential difference between the memory control gate and the drain of the sense transistor during the programming operation. Since the select transistor is turned on during programming, the drain potential of the sense transistor is essentially equal to the voltage applied to the bit line. Normally, the memory control gate is grounded, and thus $V_{TL}$ is proportional to the positive voltage applied to the bit line. As noted previously, this voltage cannot be increased beyond a certain level without raising the risk of breakdown. The primary concern is field-aided junction breakdown in a select transistor contained in a cell other than the one being programmed.

With a back-biased substrate, the potential difference between the memory control gate and the bit line during programming may be increased by reducing the voltage of the memory control gate. This has the same effect on $V_{TL}$ as increasing the programming voltage on the bit line by an equivalent amount.

Figure 1:
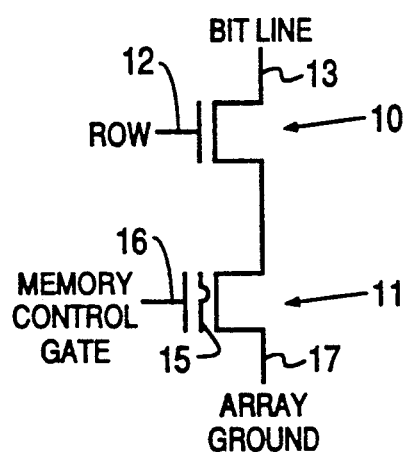
FIG. 1 is a schematic diagram of a typical EEPROM cell.
Figure 2:
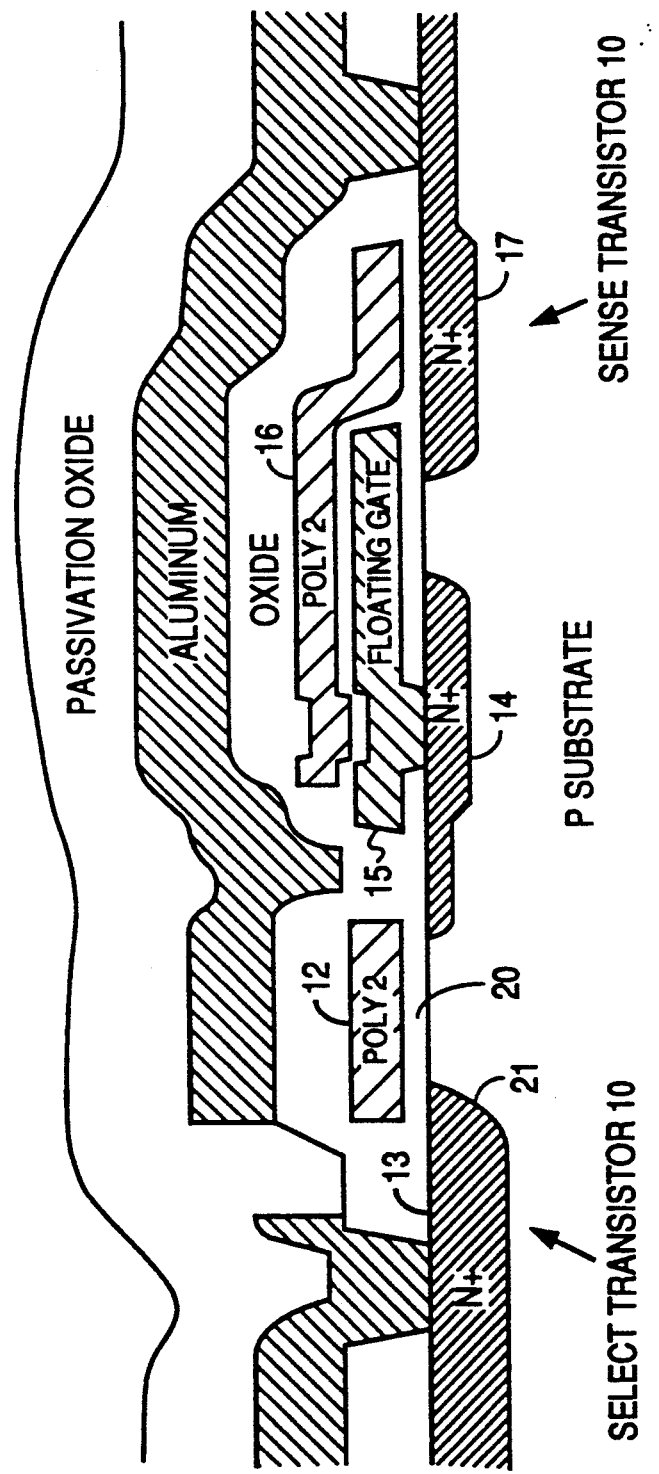
FIG. 2 illustrates the structure of the cell shown in FIG. 1.
Figure 5:
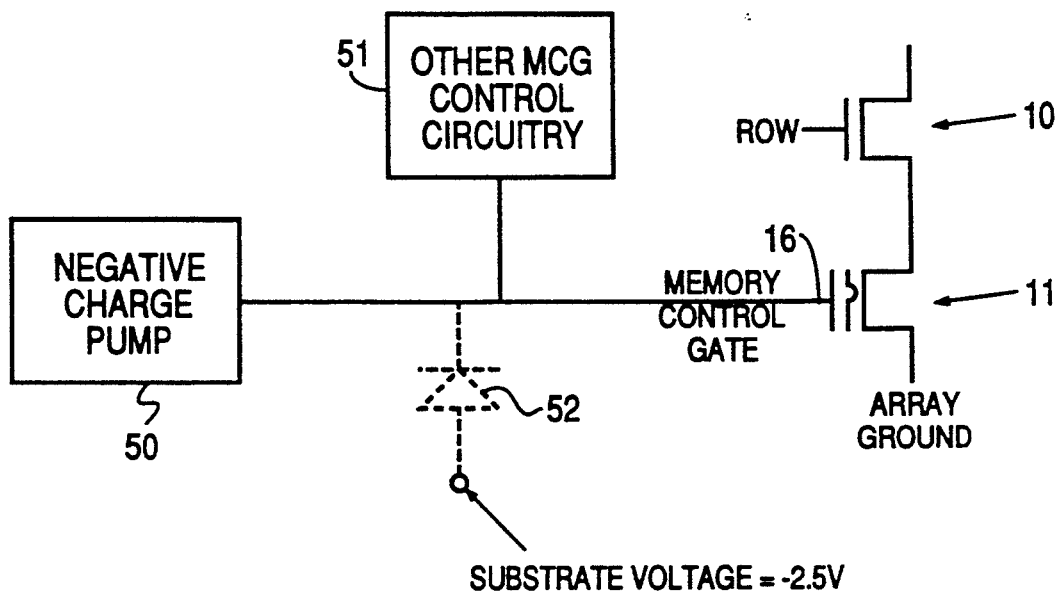
FIG. 5 illustrates an arrangement in accordance with this invention.

A structure for doing this is illustrated in FIG. 5. The EEPROM cell consisting of select transistor 10 and sense transistor 11 is identical to the cell illustrated in FIG. 1. A negative charge pump 50 is connected to memory control gate 16. The box labeled 51 represents other control circuitry, such as the circuitry which controls memory gate 16 during the erase and read cycles.

The substrate of the cell pictured in FIG. 5 is biased to a voltage of $-2.5$ V. The diode 52 shown in hatched form in FIG. 5 represents a PN junction somewhere on the same chip which could be forward-biased if the voltage of memory control gate 16 falls below the voltage of the substrate. Since diode 52 has a threshold voltage of 0.7 V, the voltage applied by negative charge pump 50 to memory control gate 16 could, in theory, be reduced to $-3.2$ V without creating a forward-biased PN junction in diode 52 that could initiate latch-up. In reality, there may be other parasitic devices which limit the degree to which the voltage at memory control gate 16 may be reduced.

Figure 3:
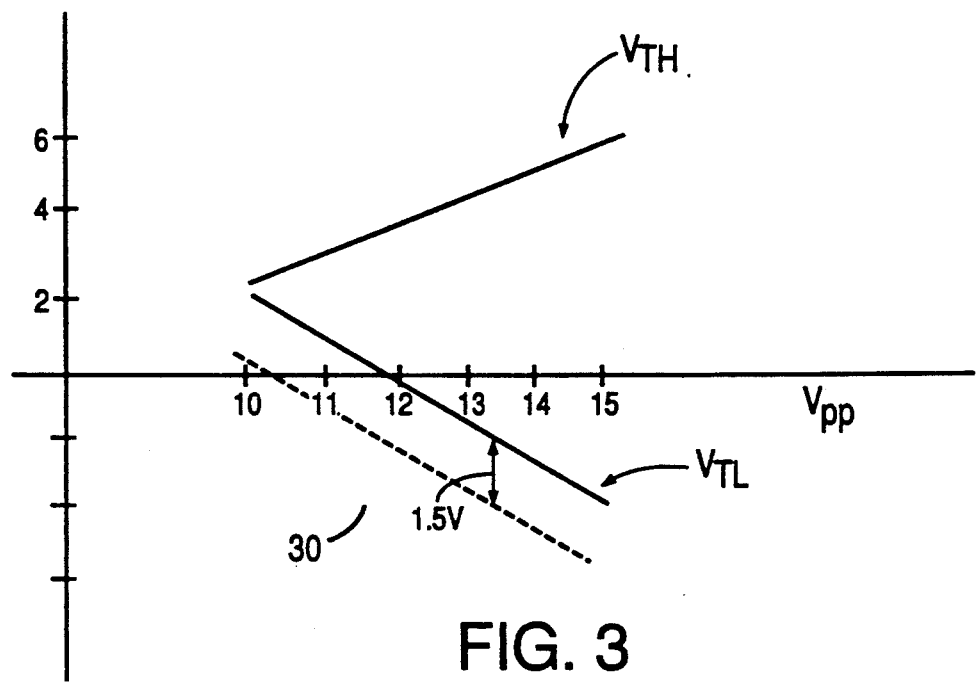
FIG. 3 is a graph of $V_{TH}$ and $V_{TL}$ as a function of the programming voltage.
Figure 4:
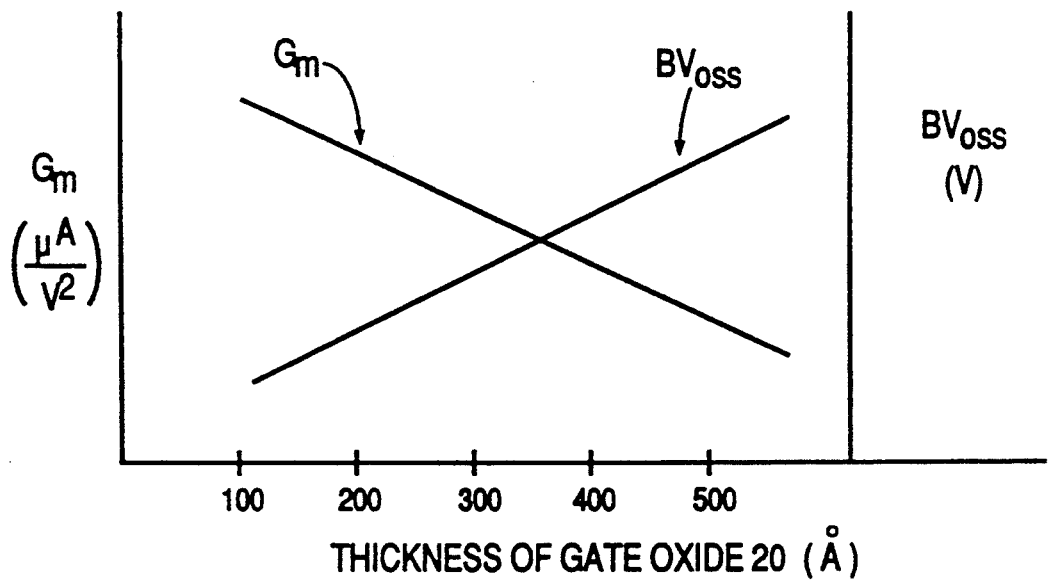
FIG. 4 is a graph of the transconductance and the source-to-drain breakdown voltage of select transistor 10 as a function of the thickness of the gate oxide.

Assuming that negative charge pump 50 applies a voltage of $-1.5$ V to memory control gate 16, the hatched line 30 in FIG. 3 illustrates the $V_{TL}$ curve for the device shown in FIG. 5. The $V_{TL}$ curve for the cell shown in FIG. 1 has been displaced downward approximately 1.5 V. The margin has increased an equivalent amount.

Accordingly, using the method and structure of this invention, the margin of an EEPROM cell may be increased, yielding a larger current in the cell and longer data retention, without increasing the programming voltage or increasing the risk of field-aided junction voltage breakdown.

The foregoing description of an embodiment of this invention is intended to be illustrative and not limiting. Other embodiments and methods in accordance with this invention will be apparent, all of which are within the broad scope of this invention.

I claim:

1. A method of programming an EEPROM cell which includes a sense transistor, said sense transistor being formed in a substrate of a first conductivity type and comprising a first region of a second conductivity type, a second region of said second conductivity type, a floating gate, and a memory control gate, said floating gate being separated from said first region by a layer of dielectric material, the method comprising the steps of:

biasing said first region to a positive voltage;

biasing said memory control gate to a negative voltage, thereby causing electrons to tunnel through said layer of dielectric material from said floating gate to said first region; and lowering the voltage of said substrate to a level less than or equal to the voltage of said memory control gate plus 0.7 volts.

2. The method of claim 1 including the step of using a negative charge pump to bias said memory control gate to a negative voltage.

3. An EEPROM cell comprising:

a select transistor;

a sense transistor formed in a substrate of a first conductivity type and comprising a first region and a second region of a second conductivity type;

a memory control gate; and a floating gate, said floating gate being separated from said first region by a layer of dielectric material, said layer of dielectric material having a thickness designed to permit electron tunneling between said floating gate and said first region when said EEPROM cell is being programmed;

a means for maintaining said memory control gate at a negative voltage; and a means for biasing said substrate at a voltage less than or equal to the voltage of said memory control gate plus 0.7 volts.

4. The EEPROM cell of claim 3 wherein said means comprises a negative charge pump.

5. The method of claim 1 wherein said first region is connected through a select transistor to a bit line, the voltage of said bit line being raised to about 14.5 volts.

6. The method of claim 1 wherein said first and second conductivity types are P and N, respectively.

7. The EEPROM cell of claim 3 wherein first and second regions are of N-type material and said substrate is of P-type material.

8. The EEPROM cell of claim 3 wherein said layer of dielectric material also extends between said floating gate and a channel region of said substrate, the thickness of said layer between said floating gate and said channel region being greater than the thickness of said layer between said floating gate and said first region.

* * * * *